US007221581B2

(12) United States Patent
Jacquet et al.

(10) Patent No.: US 7,221,581 B2
(45) Date of Patent: May 22, 2007

(54) MEMORY WITH STORAGE CELLS BIASED IN GROUPS

(75) Inventors: Francois Jacquet, Froges (FR); Florent Vautrin, Vizille (FR)

(73) Assignee: ST Microelectronics SA, Montrouge (FR)

( * ) Notice: Subject to any disclaimer, the term of this patent is extended or adjusted under 35 U.S.C. 154(b) by 0 days.

(21) Appl. No.: 11/274,039

(22) Filed: Nov. 14, 2005

(65) Prior Publication Data
US 2006/0133161 A1    Jun. 22, 2006

(30) Foreign Application Priority Data
Nov. 15, 2004    (FR)  ............................. 04 12089

(51) Int. Cl.
G11C 11/00    (2006.01)
G11C 7/00    (2006.01)
(52) U.S. Cl. .................. 365/154; 365/156; 365/189.09
(58) Field of Classification Search ................ 365/154, 365/156, 185.18, 185.27, 189.09
See application file for complete search history.

(56) References Cited

U.S. PATENT DOCUMENTS

| 5,732,015 | A * | 3/1998 | Kazerounian et al. | ...... 365/154 |
| 6,914,803 | B2 * | 7/2005 | Yamaoka et al. | ........... 365/154 |
| 7,079,413 | B2 * | 7/2006 | Tsukamoto et al. | ......... 365/154 |

| 2001/0038552 | A1 | 11/2001 | Ishimaru |
| 2003/0016552 | A1 | 1/2003 | Satomi |

OTHER PUBLICATIONS

Kawaguchi, H., et al.: "Dynamic leadage cut-off scheme for low-voltage SRAM's"; VLSI Circuits, 1998; IEEE, US, Jun. 11, 1998; pp. 140-141, XP010291240; ISBN 0-7803-4766-8.
Kyeong-Sik, Min., et al.: Row-by-Row dynamic Source-Line Voltage Control (RRDSV) Scheme for Two Orders of Magnitude Leakage Current Reduction of Sub-1-V-$V_{DD}$ SRAM's; International Symposium on Low Power Electronics and Design, NY, NY; ACM, US, Aug. 25, 2003; pp. 66-71; XP010658589; ISBN: 1-58113-682-X.

* cited by examiner

*Primary Examiner*—Son Dinh
(74) *Attorney, Agent, or Firm*—Lisa K. Jorgenson; Jose Gutman; Fleit, Kain, Gibbons, Gutman, Bongini & Bianco P.L.

(57) ABSTRACT

A memory circuit includes a plurality of storage cells (100) arranged in rows and columns thus forming a storage matrix. The storage cells (100) corresponding to the same bit line (21-23) are divided into several groups (60-61) of cells for the same column, these groups having their own biasing circuit (200) in order to act on the difference between the logic level low voltage and the substrate voltage of the link transistors. When a storage cell is not selected, the biasing circuit makes the voltage between source/drain and substrate equal to a negative voltage in order to minimize the leakage current. During a read operation, the substrate voltage and the source/drain voltage are brought back to the same level such that a maximum current will flow when the link transistor is conducting.

19 Claims, 5 Drawing Sheets

MEMORY WITH STORAGE CELLS BIASED IN GROUPS

CROSS-REFERENCE TO RELATED APPLICATION

This application is based upon and claims priority from prior French Patent Application No. 04 12089, filed on Nov. 15, 2004, the entire disclosure of which is herein incorporated by reference.

BACKGROUND OF THE INVENTION

1. Field of the Invention

The invention relates to an electronic memory and, more particularly, to a biasing circuit designed to bias the memory cells in groups.

2. Description of the Related Art

Memories are known electronic circuits that are in increasing use. A memory circuit comprises a plurality of storage cells organized in rows and columns. Each storage cell stores one data bit, that is to say a bit of information that can take the value "0" or "1". Address lines connect all the cells of the same row together in order to allow the selection of a row from amongst the plurality of rows forming the memory. Bit lines connect the cells of the same column together in order to allow the reading and writing of a bit in a memory cell belonging to a bit line and whose address line is selected.

The storage cells can be of various types depending on the type of memory used. Among the various types of storage cells, those having at least one transistor linking the element storing the data bit to the bit line are of more particular interest. By way of example, memories of the static RAM type generally have one or two link transistors for connecting the contents of the cell to one or two bit lines depending on whether the read operation is carried out directly on a single bit line, or differentially between two complementary bit lines. Also, some memories of the ROM type have a link transistor for connecting the contents of the storage cell to the bit line.

Memory circuits are continually increasing in size. Thus, a bit line for a large-sized memory may be connected to several hundred, or even several thousand, link transistors. In order to read a storage cell, an address line selects a storage cell whereas all the other address lines do not select any storage cells in the same column. The storage cell being read has its link transistor turned on and a large conduction current appears for charging or discharging the bit line in order to transmit the logic level stored by the cell to a read circuit.

One problem arises when there is a very large number of link transistors connected to a bit line, since the link transistors, even when turned off, exhibit a leakage current that becomes non-negligible when this leakage current is multiplied by a large number of link transistors. The problem is even more acute when it is desired to read a cell in a particular state, for example a "1" state corresponding to a high voltage, while all the other cells not selected are in the other state, for example the "0" state corresponding to a low voltage. Indeed, the sum of the leakage currents over the whole of the transistors may greatly reduce the read current delivered by the selected cell, thus greatly increasing the time required for reading a memory cell. But in the case of static RAM memories, if the leakage current is too large, this can make the state of the selected storage cell, and hence the stored value, change.

Currently, one solution to the aforementioned problem consists in using main bit lines and secondary bit lines. The secondary bit lines are parallel to the main bit lines and are connected to a reduced number of cells, for example 32 cells. A transfer gate links each secondary bit line to the main bit line. Thus, when a storage cell is selected, only the leakage currents of the group of cells connected to the same secondary bit line can influence the read time and the possible loss of data from the cell. However, in terms of read time, the propagation time through the link transistor and through the transfer gate is relatively long. Also, in terms of size, the bit lines are lines of metallization which must be disposed where no cell is situated and, therefore, doubling the number of bit lines by means of main and secondary lines is detrimental to the capacity for integration of a memory.

Accordingly, there exists a need for overcoming the disadvantages of the prior art as discussed above.

SUMMARY OF THE INVENTION

The invention proposes a different solution for solving the problem of current leak through the link transistors. The storage cells corresponding to the same bit line are divided up in order to define several groups of cells for the same column, the groups having their own biasing circuit in order to act on the difference between the logic level low voltage and the substrate voltage of the link transistors. Indeed, the leakage current is higher when a link transistor of the n-MOS type is turned off and when the source or drain voltage is equal to the substrate voltage. According to the invention, when a storage cell is not in a selected group, a potential difference is introduced between the low logic level voltage and the substrate voltage. Thus, the biasing circuit will make the voltage between the source (or the drain) and the substrate equal to a negative voltage in order to reverse bias and turn the transistor hard off such that the latter exhibits a minimized leakage current. During the read operation, the substrate voltage and the low logic level voltage are brought back to the same level so that the advantage of a maximum current when the link transistor is conducting will be recovered.

The subject of the invention is a memory circuit comprising a plurality of elementary storage cells. The elementary cells are arranged in rows and in columns thus forming a storage matrix. Each elementary cell stores a logic level "0" or "1", each logic level corresponding to a low voltage or a high voltage that is assigned to it. Each elementary cell of the same column comprises at least one link transistor connecting the elementary cell to at least one same bit line. The link transistor is a transistor of the n-MOS type whose substrate is biased at a substrate voltage. The memory circuit also comprises at least two biasing circuits. The elementary storage cells of the same column are divided into at least two groups of cells. Each group of cells is associated with a respective biasing circuit designed to receive a group selection signal. The biasing circuit is connected to the cells of its associated group in order to ensure that the substrate voltage and low voltage are the same when the associated group is selected, and in order to ensure that the potential difference between the substrate voltage and the low voltage is negative when the associated group is not selected.

Various embodiments may be implemented. According to a first embodiment, the biasing circuit supplies the low voltage to the elementary storage cells of its associated group. The low voltage is equal to the substrate voltage when the group is selected, or is equal to a higher voltage than the substrate voltage when the group is not selected.

According to another embodiment, the biasing circuit supplies the substrate voltage for the transistors of the n-MOS type of the cells of its associated group. The substrate voltage is equal to the low voltage when the group is selected, or is equal to a lower voltage than the low voltage when the group is not selected.

According to an alternative embodiment, each biasing circuit comprises a ground terminal for receiving a ground voltage; a biasing terminal for receiving a bias voltage; an output terminal connected to the elementary cells of the group; a switch connecting the output terminal to the ground terminal when the associated group is selected or connecting the output terminal to the biasing terminal when the associated group is not selected. The switch comprises a first MOS transistor having its drain connected to the output terminal, its source being connected to the ground terminal, and its gate being connected for receiving a first control signal; a second MOS transistor having its drain connected to the output terminal, its source being connected to the biasing terminal, and its gate being connected for receiving a second control signal. The first control signal is active when the group of elementary cells is selected. The second control signal is active when the group of elementary cells is not selected.

BRIEF DESCRIPTION OF THE DRAWINGS

The invention will be better understood and other features and advantages will become apparent upon reading the description that follows which makes reference to the appended drawings, in which.

DETAILED DESCRIPTION

Figure 1:
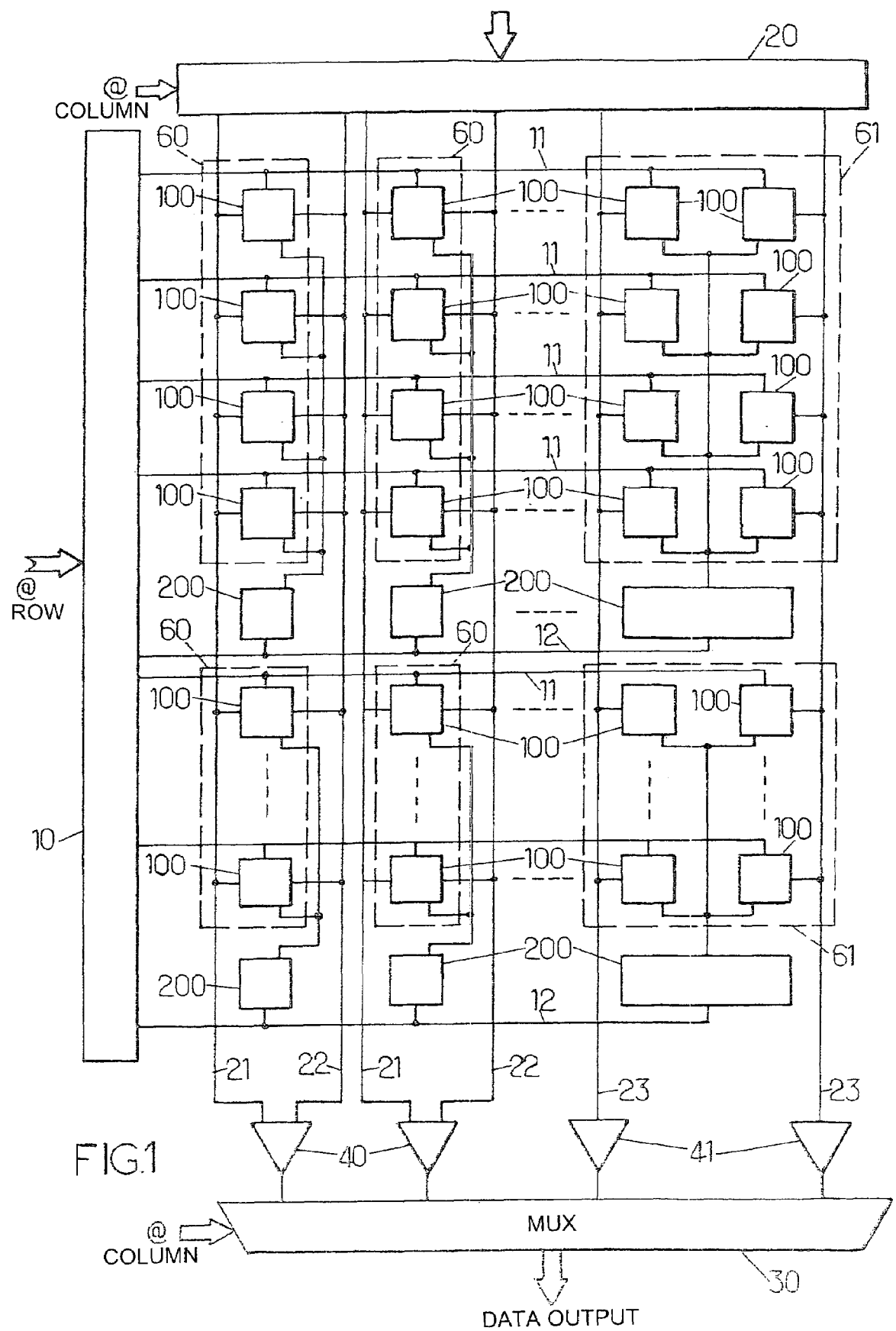
FIG. 1 shows an example of memory circuit according to the invention.

FIG. 1 shows an example of memory circuit according to the invention. The memory circuit comprises a row decoder 10, a data writing circuit 20, a read multiplexer 30, read amplifiers 40 and 41, storage cells 100 and biasing circuits 200. The storage cells 100 are arranged in rows and columns. These storage cells 100 are also arranged into groups of cells 60 and 61. The groups of cells 60 and 61 show two variant embodiments of the memory circuit according to the invention that are detailed in the following description.

The row decoder circuit 10 receives a row address that is decoded in order to select a corresponding address line from amongst a plurality of address lines 11. Each address line 11 is connected to a plurality of storage cells 100 disposed on the same line. In addition, the row decoder will also select a control line 12 when an address line 11 corresponding to a group of rows 60 or 61 is associated with a corresponding biasing circuit 200. The control line 12 will thus control a whole biasing circuit 200 line corresponding to one of the selected address lines 11. The other control lines 12 are not selected.

The write circuit 20 receives a column address together with a data value to be written and will select one or more bit lines from the bit lines 21 to 23 in order to supply it with the data value to be written. When the circuit operates in read mode, the write circuit will only bias the bit lines 21 to 23. Those skilled in the art will note that the lines 21 and 22 are connected to the same storage cell column so as to allow a differential write or read operation to be performed. Stated otherwise, the bit line 21 carries a data value that is inverted with respect to the bit line 22 according to a known technique. The bit lines 23 are single bit lines for one storage cell column 100. Those skilled in the art will note that the groups of cells 60 are made up of several cells from the same column, whereas the groups 61 are made up of cells over two columns.

The fact that the columns are of the differential or non-differential type does not affect the invention. Likewise, the groups of cells 60 and 61 can be of different sizes without this impacting the invention. In a memory circuit, it goes without saying that all the cells are of the same type and that the groups are all identical. The presentation of the diagram in FIG. 1 allows various possibilities to be illustrated in the same figure.

The read amplifiers 40 are connected to two bit lines 21 and 22 corresponding to the same column in order to supply a data value "0" or "1" representing the value of the bit from the storage cell corresponding to the selected address line. The amplifiers 41 are threshold amplifiers that, depending on the value on the bit line 23, will take the value "0" or "1". The read multiplexer 30 will select, as a function of a column address, the output of the read amplifier 40 or 41 that must be read.

Memories can be organized in words, meaning that an input data value, and also an output data value, will be in the form of a word of several bits. In this case, both the write circuit and the read multiplexer 30 will select a plurality of bit lines corresponding to as many bit lines as the input or output word comprises bits.

Each biasing circuit 200 is connected to all the storage cells 100 of a group 60 or 61 with which it is associated.

The operation of a storage cell 100 and of the biasing circuit 200 will now be detailed with the aid of FIGS. 2 to 5 that show various embodiments of the invention.

Figure 2:
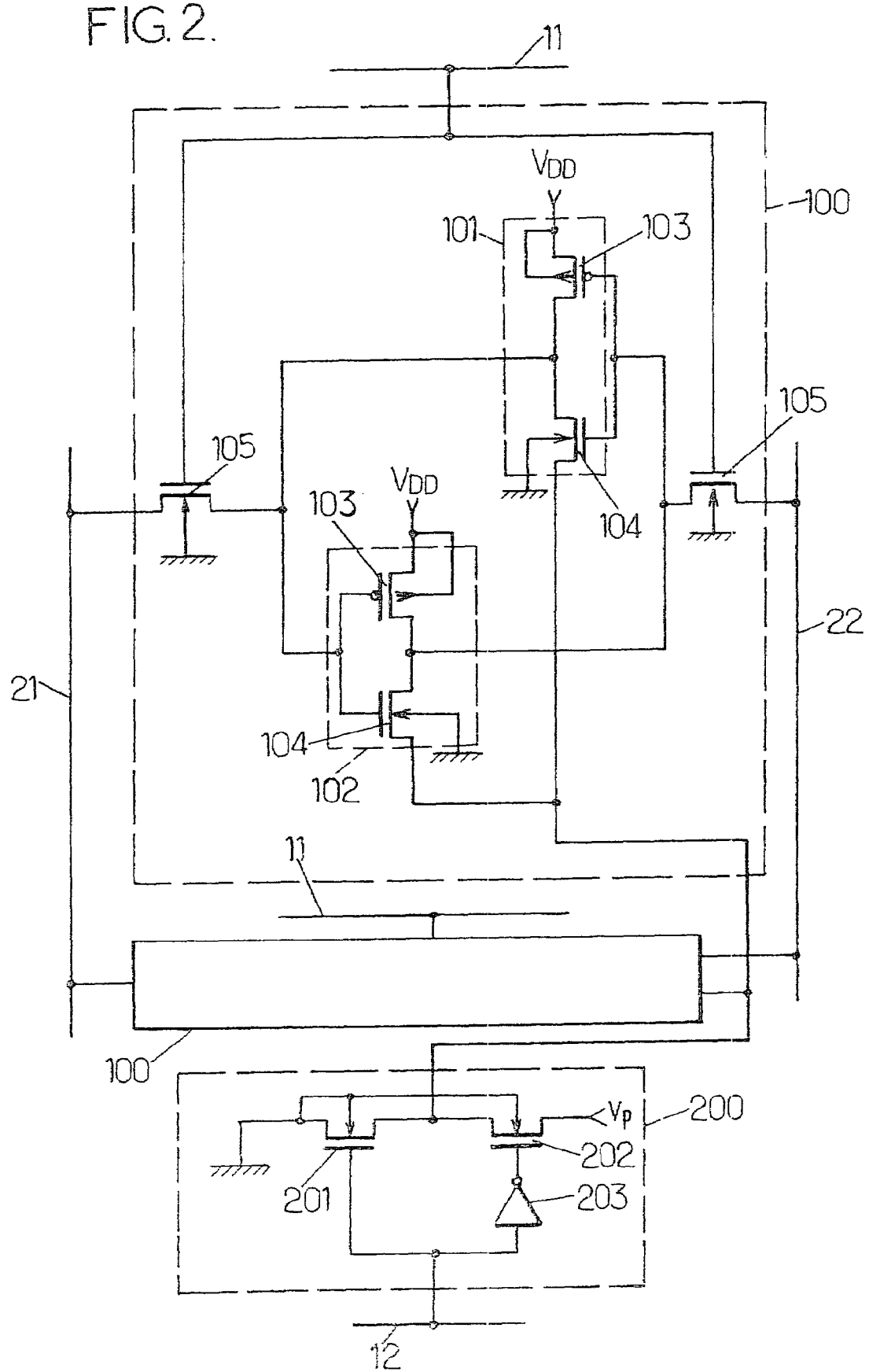
FIGS. 2 to 5 shows various embodiments of storage cells and of biasing circuits according to the invention.

FIG. 2 shows a first embodiment that is applicable to a storage cell 100 of the static RAM type with six transistors. The storage cell 100 comprises two inverters 101 and 102 configured as a flip-flop, each inverter comprising a p-channel MOS transistor 103 and an n-channel transistor 104. The gates of the transistors 103 and 104 of the inverter 101 are connected to the drains of the transistors 103 and 104 of the inverter 102. In a reciprocal manner, the gates of the transistors 103 and 104 of the inverter 102 are connected to the drains of the transistors 103 and 104 of the inverter 101. The sources of the transistors 103 receive a voltage $V_{dd}$ equal to the voltage of the logic level "1". The sources of the transistors 104 receive a voltage corresponding to the logic level "0" which here is supplied by the biasing circuit 200. Link transistors 105 connect the drains of the transistors 103 and 104 of the inverters 101 and 102 to the bit lines 21 and 22, respectively. In this exemplary embodiment, the substrates of the p-channel transistors 103 are directly connected to the voltage of logic level "1", and the substrates of the transistors 104 and 105 are connected to the ground voltage of the circuit which is, for example, equal to 0 volts. The gates of the link transistors 105 are connected to the address line 11 in order to make the connection between the bit lines 21 and 22 and the drains of the inverters 101 and 102 when the address line 12 selects the row to which the cell 100 belongs. When this address line 12 does not select the cells 100 of the row, the link transistors 105 are turned off.

The biasing circuit 200 comprises a transistor 201 and a transistor 202. The transistors 201 and 202 have their drains connected together in order to supply the bias voltage to the storage cell 100. The transistor 201 has its source connected to ground and also to its substrate. The transistor 202 has its source connected to a bias voltage $V_p$ and its substrate connected to ground. In the example described, the bias voltage $V_p$ is for example equal to 200 millivolts, for a circuit whose logic level "1" voltage $V_{dd}$ is equal to 1.2 volts. The gate of the transistor 201 is directly connected to the control line 12. The gate of the transistor 202 is connected to the control line 12 via an inverter 203 such that only one of the transistors 201 or 202 is conducting. When the address line 11 selects the storage cells 100 of the corresponding row, the biasing circuits 200, associated with the groups to which the cells of the selected address line belong, are also selected. When the control line 12 is selected, this is at a logic level "1" which makes the transistor 201 conduct, thus connecting the sources of the transistors 104 to the ground voltage. For a storage cell thus biased, when the latter is selected, the transistors 105 are conducting which connects, on the one hand, a logic level "0" to the bit lines and, on the other, a logic level "1" to the other line. The logic level "1" will charge up the bit line, for example the bit line 22, and the level "0" will discharge the bit line 21. The read operation will be carried out in a differential read amplifier 40 and the stored logic level will be read. On the other hand, for the other cells of the same group that are not selected, the transistors 105 will be turned off but will allow a leakage current equal to $I_{fmax}$ to flow.

On the contrary, for the storage cells belonging to groups wherein no address line is selected, the control line 12 will be at a logic level "0" thus turning the transistor 201 off and making the transistor 202 conduct. For these cells, the logic level "0" will be equal to the voltage $V_p$ which is, for example, equal to 200 millivolts. Thus the transistors 105, whose address line will be at level "0", will be turned off, but since the logic level "0" is at 200 millivolts, the leakage current of the transistors will be equal to $I_{fmin}$.

Indeed, the current in an n-MOS transistor depends, amongst other things, on the substrate bias voltage. It will be recalled that the threshold voltage $V_{dd}$ of an n-MOS transistor is given by the following formula that is well known to those skilled in the art:

$$V_{th} = V_{t0} + a \cdot (\sqrt{|P_s + V_{sb}|} - \sqrt{P_s})$$

with a: a substrate effect parameter;
$P_s$: the surface potential;
$V_{sb}$: the potential difference between the source and the substrate; and,
$V_{t0}$: the intrinsic threshold voltage of the transistor.

From this threshold voltage, the conduction current $I_{on}$ of the transistor when it is conducting can be obtained:

$$I_{on} = 0.5 \cdot K_p \frac{W}{L} \sqrt{V_{Gs} - V_{th}}$$

and also the leakage current $I_{off}$ of the transistor when it is turned off:

$$I_{off} = I_{on} \cdot e^{\left(\frac{q}{n \cdot K \cdot T}(V_{GS} - V_{th}) - 1\right)}$$

with Kp: a transconductance parameter;
q: the electronic charge;
K: the Boltzmann constant;
T: the temperature;

n: a slope parameter below the threshold;
W: the channel width; and,
L: the channel length.

Thus, biasing the substrate at a lower voltage than the source voltage has the effect of increasing the threshold voltage $V_{th}$ of the n-MOS transistors which causes a reduction in the conduction current $I_{on}$ and an even greater reduction in the leakage current $I_{off}$. Therefore, the following relationship holds:

$$I_{fmin} \ll I_{fmax}$$

Consequently, only the leakage currents of the selected group, corresponding to $I_{fmax}$, are to be considered as a problem, the leakage currents of the group not selected, corresponding to $I_{fmin}$, being negligible. Accordingly, a reasonable number of cells for each group should be chosen in order to significantly reduce the leakage current phenomenon.

The use of the biasing circuit 200 could lead those skilled in the art to think that the integration of the memory might be less important than for a conventional memory. However, for conventional memories, the groups of cells already exist and require transfer gates and additional bit lines whose size is larger than that of the biasing circuits 200. The use of the biasing circuit 200 that introduces a potential difference between the sources and the substrates of the link transistors 105 obviates the need for secondary bit lines and transfer gates between the main and secondary bit lines. Furthermore, the transistors 104 of the inverters 101 and 102 also then have a reduced leakage current when their group is not selected, which has the effect of reducing the overall static power consumption of the memory circuit.

Figure 3:
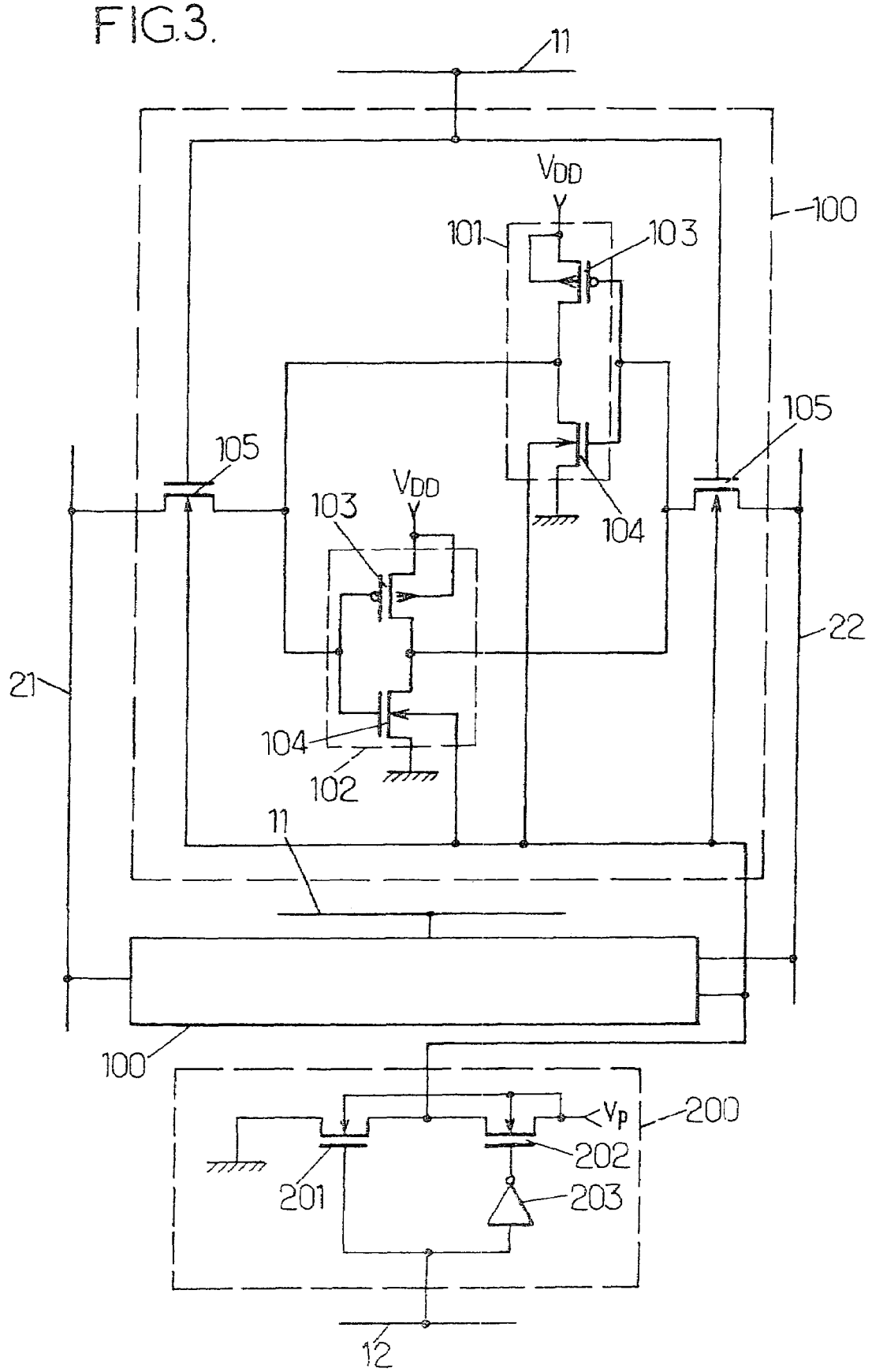

FIG. 3 shows a variant of the embodiment in FIG. 2. The storage cell 100 in FIG. 3 is basically identical to that in FIG. 2 apart from the fact that the sources of the transistors 104 are connected to ground potential 0 volts corresponding to the logic level "0". Also, the substrates of the n-channel transistors 104 and 105 are connected to the biasing circuit 200. The biasing circuit 200 is identical in its structure aside from the fact that the voltage Vp here is a negative voltage equal to, for example, −300 millivolts. Since the voltage Vp is lower than ground voltage, the substrates of the transistors 201 and 202 are connected to the voltage Vp.

Regarding the operation of the circuit in FIG. 3, this is similar to that in FIG. 2 except that instead of acting on the voltages of logic level "0", it is the well voltages of the n-channel transistors that are acted on. The advantage of this variant is that the absolute value of the potential difference between source and substrate can be higher in FIG. 3 relative to FIG. 2. Indeed, in FIG. 2, the potential of the level "0" is closer to the potential of the level "1", which may cause some threshold instability problems for the inverters 101 and 102 when the level "1" voltage is relatively low. Nevertheless, the use of a voltage that is higher in absolute value between the source and the substrate does allow a greater reduction in the leakage currents of the n-channel transistors. However, a drawback of the circuit in FIG. 3 with respect to the circuit in FIG. 2 is that it is the wells of the n-channel transistors that need to be biased which is not always easy to implement. Also, a source of negative voltage needs to be generated by means of, for example, a charge pump circuit which may be difficult to implement in a memory circuit and which may also increase the power consumption by more than the reduction achieved in minimizing the leakage currents.

Figure 4:
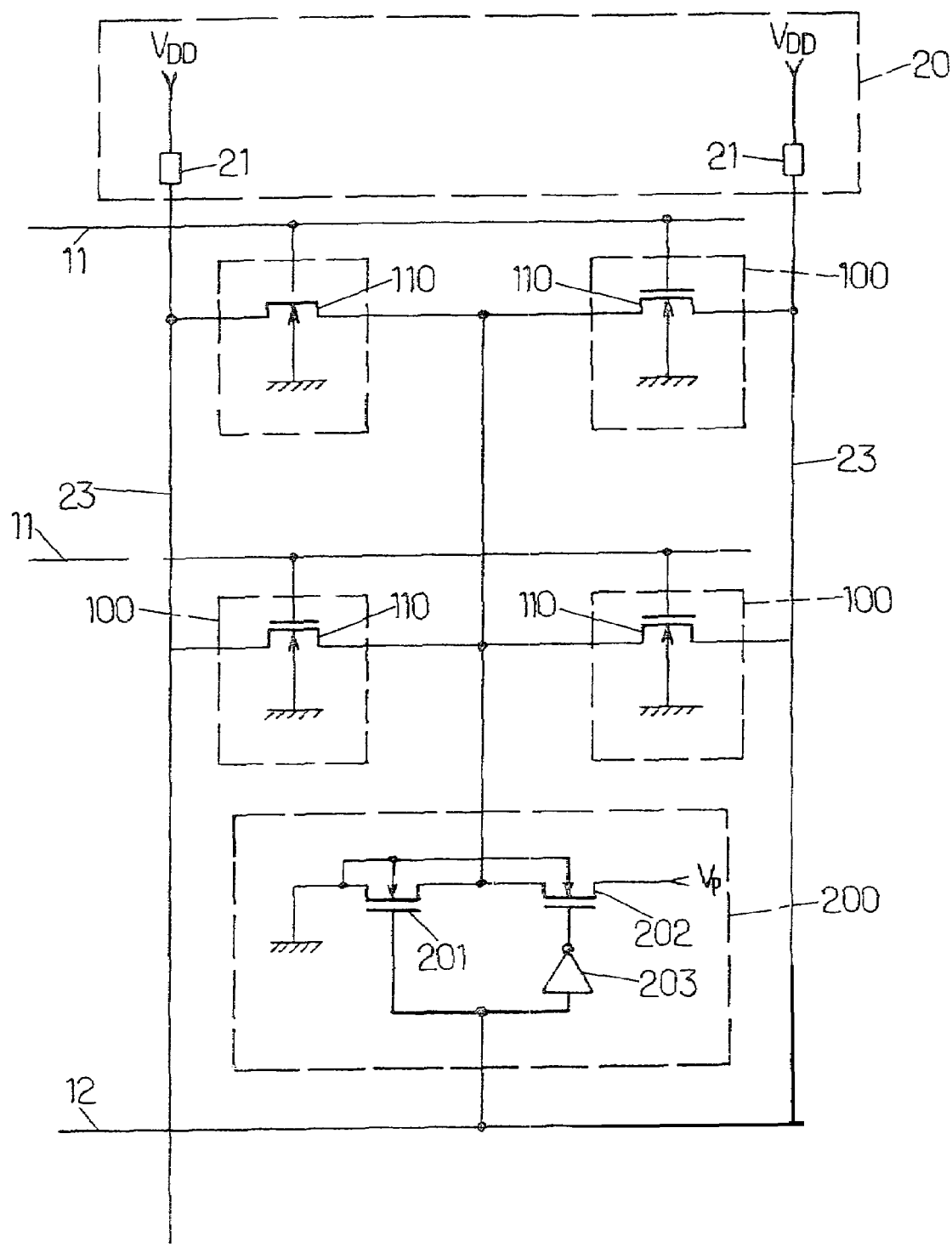

FIG. 4 shows another variant in which the storage cells 100 are cells of the ROM type with one transistor. Each storage cell 100 comprises a single transistor 110 that stores, by virtue of its construction, either a "0" state or a "1" state. The transistor 110 also plays the role of link transistor. During its fabrication, a thick insulator is added on top of the thin-film insulator before the polysilicon deposition for the transistors 110 whose state is to be set to "1", in order to neutralize the gate. The transistors whose state is to be set at "0" are fabricated in the normal fashion. These transistors 110 are connected by their gates to an address line corresponding to the line onto which the cells are placed. Their drains are connected to the bit line 23 in order to allow a read operation when the cell 100 is selected.

As an inactive and non-writable memory, the read circuit 20 is only used as a pre-charging circuit for the bit lines 23. By way of example, the write circuit 20 comprises pull-up resistors 21 connected, on the one hand, to the bit line and, on the other, to the voltage $V_{dd}$ corresponding to the logic level "1". Thus, the storage cells 100 have the drain of their single transistor 110 connected, in this figure, to a voltage level corresponding to the logic level "0" which is supplied by the biasing circuit 200.

The substrates of the transistors 110 are connected to ground voltage, 0 volts. When a storage cell 100 is selected, if the transistor stores a logic level "1", it does not make the connection to the bit line 23 and the pull-up resistor 21 will bring the bit line to the potential $V_{dd}$ corresponding to the logic level "1". However, the bit line 11 behaves as a capacitor and it is imperative to limit the leakage currents corresponding to all the storage cells connected to this bit line in order to reduce the read time.

As was previously explained, the voltage supplied by the biasing circuit 200 which, in the present example, is also identical to the circuit 200 in FIG. 2, supplies a voltage of level "0" which may be equal either to 0 volts, or to $V_p$, with $V_p$ corresponding to a voltage level higher than 0 volts, for example 100 to 200 millivolts for a voltage $V_{dd}$=1.2 volts. Accordingly, amongst all the storage cells connected to the bit line 23, only those belonging to the same group of cells as the cell that is the object of a read operation will have high leakage currents, while the other cells will have greatly reduced leakage currents by having a logic level "0" set at a higher voltage than the substrate voltage.

Figure 5:
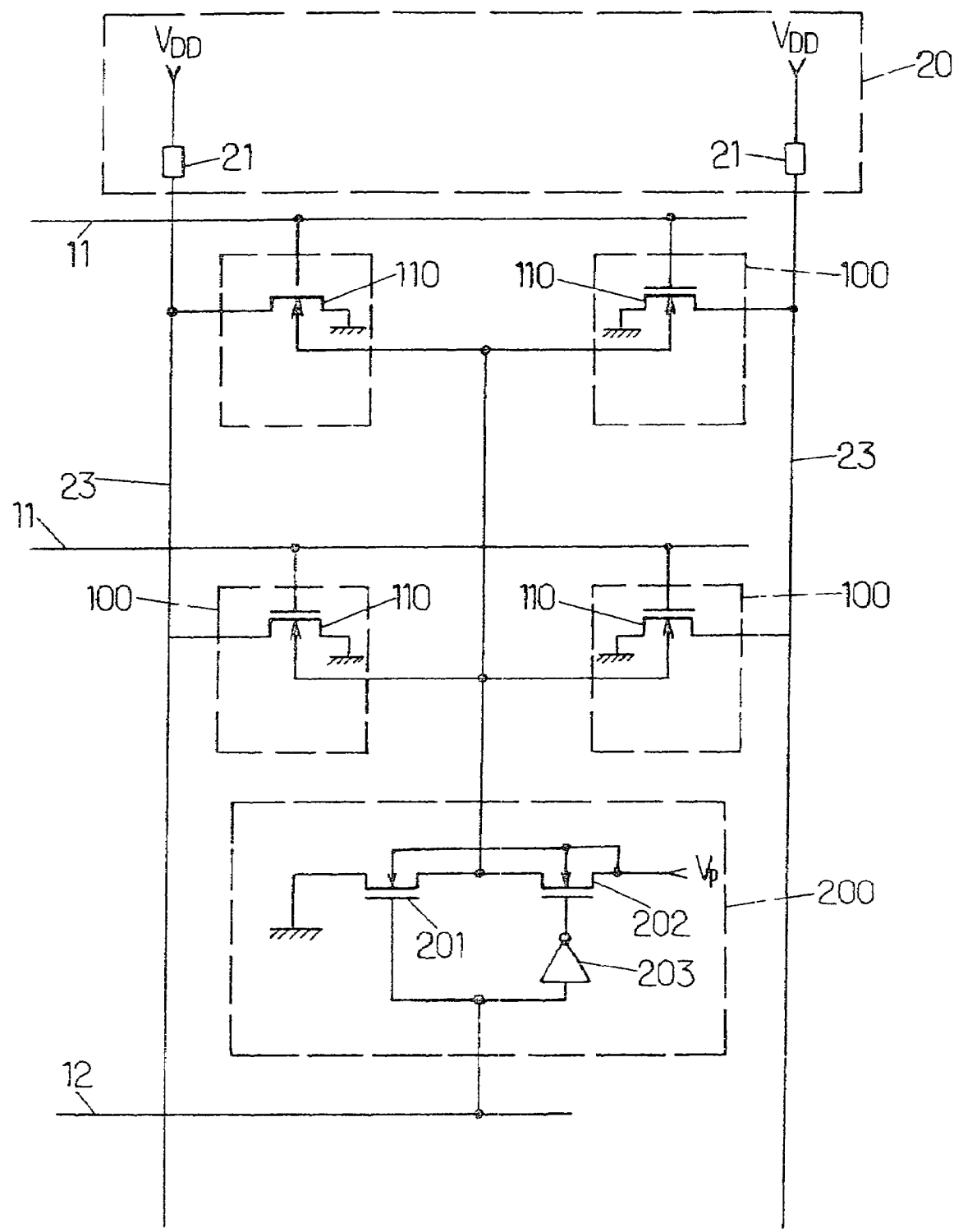

FIG. 5 shows an alternative variant from that in FIG. 4 in which the substrates of the transistors 110 are connected to the biasing circuit 200 and the sources of these transistors 110 are connected to the voltage of level "0" which is equal to 0 volts. The biasing circuit 200 is identical to the biasing circuit 200 in FIG. 3. The substrate voltage will take either the value of the voltage of logic level "0", or the value of the voltage $V_p$ which, in this example, is a negative voltage, for example in the range −100 to −300 mV.

For FIG. 5, the principle is the same as that in FIG. 4, with the only difference being that the substrate voltage will change. Here again, the same problems and advantages between the examples in FIGS. 2 and 3 are again found for FIGS. 4 and 5.

Other variants of the invention are possible. By way of example, a voltage Vp is defined that is in the range −300 to 200 millivolts, depending on whether it is the substrate or the source that is connected to the biasing circuit. This voltage may vary over a wider range. In the case of a circuit powered by a low voltage, in other words lower than 1 volt (it goes without saying that the difference between the high logic level and the low logic level must always be greater than, at least, a transistor threshold voltage), this can significantly limit the amplitude of the positive voltage that can be added onto the source. On the other hand, when the substrate is negatively biased, there exists another limitation in the inverse voltage: when the substrate voltage becomes lower than −500 millivolts, source/substrate junction breakdown phenomena appear which re-increase the leakage current. Those skilled in the art will choose the voltages to be applied and the embodiment that is appropriate depending on the fabrication processes implemented which govern the characteristics of the transistors.

In the present description, reference is made to a voltage of logic level "0" that is lower than a voltage of logic level "1". The voltages of logic level "0" or "1" are fixed arbitrarily, and it should be pointed out that if the voltages of logic level "0" and "1" are inverted, then the invention is applied by replacing the logic level "0" by the logic level "1" and vice versa. In all cases, one of the logic levels is assigned to a high voltage and the other logic level is assigned to a low voltage. The invention applies to the low voltage independently of the logic level that has been arbitrarily assigned to the voltage of low logic level in the examples previously described.

The invention describes an embodiment using memories of the ROM type having a single bit line and memories of the SRAM type having two bit lines for a differential read operation and write operation. It goes without saying that the number of bit lines remains independent from the invention, namely that if a single bit line generally suffices for the memory cells of ROM type and if memories of the SRAM type generally comprise two bit lines, an SRAM memory may very well use a single bit line or a higher number of bit lines, for example for multi-port RAMs, where the number of bit lines is equal to twice the number of ports used for performing simultaneous differential read operations over several ports. In the case especially of multi-port static RAM memories, the invention becomes even more advantageous from the fact that a single biasing circuit can be used in place of a plurality of transfer gates between the main and secondary bit lines as was the case in the prior art. Nor is the invention limited to memories of the SRAM or ROM type. On the contrary, it is applicable to any type of memory using link transistors between the storage cells and the bit lines.

Also, as indicated previously, the groups of cells that are biased by the same biasing circuit can be distributed over one or more columns and/or one or more rows. The important feature is that there be cells belonging to at least two distinct groups of cells on the same bit line.

While there has been illustrated and described what is presently considered to be embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A memory circuit comprising:
   a plurality of elementary storage cells, the elementary storage cells being arranged in rows and in columns thus forming a storage matrix, each elementary storage cell storing a logic level "0" or "1", each logic level corresponding to a low voltage or a high voltage that is specific to it, wherein each elementary storage cell of the same column comprises at least one link transistor connecting the elementary storage cell to at least one same bit line, the at least one link transistor being a transistor of the n-MOS type whose substrate is biased at a substrate voltage, wherein the memory circuit comprises at least two biasing circuits, wherein the elementary storage cells of the same column are divided into at least two groups of cells, each group of cells being associated with a respective biasing circuit capable of receiving a group selection signal, the biasing circuit being connected to the cells of its associated group in order to ensure that the substrate voltage and low voltage are the same when the associated group is selected, and in order to ensure that the potential difference between the substrate voltage and the low voltage is negative when the associated group is not selected, and wherein the biasing circuit supplies the low voltage to the elementary storage cells of its associated group, the low voltage being equal to the substrate voltage when the group is selected, or being equal to a higher voltage than the substrate voltage when the group is not selected.

2. The memory circuit according to claim 1, wherein each biasing circuit comprises:
   a ground terminal for receiving a ground voltage,
   a biasing terminal for receiving a bias voltage,
   an output terminal connected to the elementary cells of the group,
   a switch connecting the output terminal to the ground terminal when the associated group is selected or connecting the output terminal to the biasing terminal when the associated group is not selected.

3. The memory circuit according to claim 2, wherein the output terminal of the switch is connected to a low-voltage reference terminal for each cell of the associated group, and in which the bias voltage is higher than ground voltage.

4. The memory circuit according to claim 2, wherein the output terminal of the switch is connected to the substrate of the n-MOS transistors of the associated group, and wherein the bias voltage is lower than ground voltage.

5. The memory circuit according to either of claim 2, wherein the output terminal of the switch is connected to the substrate of the n-MOS transistors of the associated group, and wherein the bias voltage is lower than ground voltage.

6. The memory circuit according to claim 2, wherein the switch comprises:
   a first MOS transistor having its drain connected to the output terminal, its source being connected to the ground terminal, and its gate being connected for receiving a first control signal,
   a second MOS transistor having its drain connected to the output terminal, its source being connected to the biasing terminal, and its gate being connected for receiving a second control signal,
   wherein the first control signal is active when the group of elementary storage cells is selected,
   and wherein the second control signal is active when the group of elementary storage cells is not selected.

7. The memory circuit according to claim 6, wherein the output terminal of the switch is connected to a low-voltage reference terminal for each cell of the associated group, and in which the bias voltage is higher than ground voltage.

8. The memory circuit according to claim 6, wherein the output terminal of the switch is connected to the substrate of the n-MOS transistors of the associated group, and wherein the bias voltage is lower than ground voltage.

9. The memory circuit according to claim 1, wherein the elementary storage cells are elementary static memory cells each comprising two inverters configured as a flip-flop.

10. The memory circuit according to claim 1, wherein the elementary storage cells are elementary ROM memory cells.

11. The memory circuit according to claim 1, wherein the elementary storage cells each comprise several transistors of the n-MOS type whose substrates are placed within one or more wells electrically connected to the wells containing the cells of its group, such that the substrate voltage is common for all the n-MOS transistors of all the elementary storage cells of the same group.

12. The memory circuit according to claim 11, wherein each biasing circuit comprises:
    a ground terminal for receiving a ground voltage,
    a biasing terminal for receiving a bias voltage,
    an output terminal connected to the elementary cells of the group,
    a switch connecting the output terminal to the ground terminal when the associated group is selected or connecting the output terminal to the biasing terminal when the associated group is not selected.

13. The memory circuit according to claim 12, wherein the switch comprises:
    a first MOS transistor having its drain connected to the output terminal, its source being connected to the ground terminal, and its gate being connected for receiving a first control signal,
    a second MOS transistor having its drain connected to the output terminal, its source being connected to the biasing terminal, and its gate being connected for receiving a second control signal,
    wherein the first control signal is active when the group of elementary storage cells is selected,
    and wherein the second control signal is active when the group of elementary storage cells is not selected.

14. The memory circuit according to claim 12, wherein the output terminal of the switch is connected to a low-voltage reference terminal for each cell of the associated group, and in which the bias voltage is higher than ground voltage.

15. The memory circuit according to claim 12, wherein the output terminal of the switch is connected to the substrate of the n-MOS transistors of the associated group, and wherein the bias voltage is lower than ground voltage.

16. The memory circuit according to claim 11, wherein the elementary storage cells are elementary static memory cells each comprising two inverters configured as a flip-flop.

17. The memory circuit according to claim 11, wherein the elementary storage cells are elementary ROM memory cells.

18. An information processing system comprising:
    a plurality of memory devices for storing information in the information processing system, wherein each of the plurality of memory devices includes a memory circuit comprising:
    a plurality of elementary storage cells, the elementary storage cells being arranged in rows and in columns thus forming a storage matrix, each elementary storage cell storing a logic level "0" or "1", each logic level corresponding to a low voltage or a high voltage that is specific to it, wherein each elementary storage cell of the same column comprises at least one link transistor connecting the elementary storage cell to at least one same bit line, the at least one link transistor being a transistor of the n-MOS type whose substrate is biased at a substrate voltage, wherein the memory circuit comprises at least two biasing circuits, wherein the elementary storage cells of the same column are divided into at least two groups of cells, each group of cells being associated with a respective biasing circuit capable of receiving a group selection signal, the biasing circuit being connected to the cells of its associated group in order to ensure that the substrate voltage and low voltage are the same when the associated group is selected, and in order to ensure that the potential difference between the substrate voltage and the low voltage is negative when the associated group is not selected, and wherein the biasing circuit supplies the low voltage to the elementary storage cells of its associated group, the low voltage being equal to the substrate voltage when the group is selected, or being equal to a higher voltage than the substrate voltage when the group is not selected.

19. The information processing system of claim 18, wherein the memory circuit of each of the plurality of memory devices comprises any of a ROM memory, an SRAM memory, a multi-port RAM memory, and a multi-port static RAM memory.

* * * * *